United States Patent
Esquius Morote

(10) Patent No.: US 11,942,923 B2
(45) Date of Patent: Mar. 26, 2024

(54) RF FILTER WITH INCREASED BANDWIDTH AND FILTER COMPONENT

(71) Applicant: RF360 SINGAPORE PTE. LTD., Singapore (SG)

(72) Inventor: Marc Esquius Morote, Munich (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 296 days.

(21) Appl. No.: 17/434,372

(22) PCT Filed: Mar. 16, 2020

(86) PCT No.: PCT/EP2020/057042
§ 371 (c)(1),
(2) Date: Aug. 26, 2021

(87) PCT Pub. No.: WO2020/187820
PCT Pub. Date: Sep. 24, 2020

(65) Prior Publication Data
US 2022/0149816 A1    May 12, 2022

(30) Foreign Application Priority Data
Mar. 15, 2019 (DE) .................. 10 2019 106 670.0

(51) Int. Cl.
   *H03H 9/56*       (2006.01)
   *H03H 7/09*       (2006.01)
   *H03H 9/54*       (2006.01)
   *H03H 9/60*       (2006.01)

(52) U.S. Cl.
   CPC .............. *H03H 9/566* (2013.01); *H03H 9/60* (2013.01); *H03H 7/09* (2013.01); *H03H 9/542* (2013.01)

(58) Field of Classification Search
   CPC ............ H03H 9/566; H03H 9/60; H03H 7/09; H03H 9/542; H03H 9/0557; H03H 7/1725; H03H 9/6433; H01P 19/20
   See application file for complete search history.

(56) References Cited

U.S. PATENT DOCUMENTS

| | | | |
|---|---|---|---|
| 2,627,598 A | | 2/1953 | Browder et al. |
| 2003/0042995 A1* | | 3/2003 | Ella ...................... H03H 9/6433 |
| | | | 333/133 |
| 2011/0193656 A1* | | 8/2011 | Erb ........................ H03H 9/542 |
| | | | 333/189 |
| 2012/0194298 A1 | | 8/2012 | Maurer |
| 2017/0133999 A1* | | 5/2017 | Ishizuka .................. H03H 9/64 |

(Continued)

FOREIGN PATENT DOCUMENTS

| | | |
|---|---|---|
| EP | 1292026 A2 | 3/2003 |
| EP | 1292026 B1 | 9/2006 |
| WO | 2018228771 A1 | 12/2018 |

OTHER PUBLICATIONS

International Search Report and Written Opinion—PCT/EP2020/057042—ISA/EPO—dated Jul. 3, 2020.

*Primary Examiner* — John W Poos
(74) *Attorney, Agent, or Firm* — Polsinelli

(57) ABSTRACT

An RF filter (BPF) with an increased bandwidth is provided. The filter comprises a half-lattice topology and a phase shifter (PS) comprising inductively coupled inductance elements in a parallel branch parallel to a first segment (S1) of a signal path (SP) between a first port (P1) and a second port (P2) of the filter.

14 Claims, 7 Drawing Sheets

(56) References Cited

U.S. PATENT DOCUMENTS

| | | |
|---|---|---|
| 2017/0244382 A1 | 8/2017 | Lear |
| 2019/0081612 A1 | 3/2019 | Tang et al. |
| 2019/0372555 A1* | 12/2019 | Shealy .................. H03H 9/706 |
| 2020/0136588 A1* | 4/2020 | Alicioglu ............. H04B 1/1036 |

* cited by examiner

RF FILTER WITH INCREASED BANDWIDTH AND FILTER COMPONENT

The present Application for Patent is a 371 of international Patent Application PCT/EP2020/057042, filed Mar. 16, 2020, which claims priority Germany Patent Application 10 2019 106 670.0, filed Mar. 15, 2019, which is hereby incorporated by referenced in its entirety and for all purposes.

The present invention refers to RF filters, e.g. for mobile communication devices, having an increased bandwidth and to corresponding filter components.

In devices of mobile communication systems RF filters are needed to separate wanted signals from unwanted signals. Such filters can be bandpass filters that employ electro acoustic resonators. The use of electro acoustic resonators allows for high isolation levels and steep filter skirts. Corresponding electro acoustic RF filters can have a ladder-type like filter topology with series resonators electrically connected in series in a signal path between an input port and an output port. Parallel resonators in parallel paths electrically connect the signal path to ground.

However, in ladder-type like filter topologies the bandwidth is essentially determined by the electro acoustic coupling coefficient κ2. However, future specifications may require a larger bandwidth. In particular, upcoming 5G bands may require bandwidths that are three to four times larger than bandwidths needed for LTE bands. Further, high out of band suppression, steep skirts, a low insertion loss within the passband, etc., are also needed.

Thus, what is wanted is an RF filter with an increased bandwidth without sacrificing other important filter parameters.

To that end, a filter according to independent claim 1 is provided. Dependent claims provide preferred embodiments.

A half lattice filter is provided that comprises an input port and an output port. Further, the filter has a signal path between the input port and the output port. The signal path has a first segment that is arranged between the input port and the output port.

Further, the filter has a parallel branch that is electrically connected in parallel to the first segment of the signal path. Further, the half lattice filter has a first electro acoustic resonator electrically connected in the first segment and an impedance element electrically connected in the parallel branch. Additionally, a phase shifter is electrically connected in the parallel branch in series to the impedance element. The phase shifter comprises two inductively coupled inductance elements.

Such a half lattice filter establishes a performance alternative to a ladder-type like circuit topology. The half lattice filter may have a reduced number of circuit elements when compared to a ladder-type like filter topology. In particular, the half lattice filter as described above provides the possibility of a substantially increased bandwidth while other filter parameters can be maintained at a high level.

It was found that the quality of the phase shifter is essential to the performance of the half lattice filter. Thus, a phase shifter comprising coupled inductance elements as described above is provided to simultaneously increase the bandwidth and maintain other performance parameters such as high out of band suppression, steep skirts, compact layout and good impedance matching.

The half lattice filter can comprise a first node and a second node. The position of the first node and of the second node, which are in the signal path, define the position of the first segment and of the parallel branch. Thus, it is possible that the first node is the position where the parallel branch and the first segment are electrically connected to one another at the side of the first port of the filter. The position of the second node is the place where the first segment and the parallel branch are electrically connected at the side of the second port of the half lattice filter.

The impedance element and the phase shifter are electrically connected in series in the parallel branch between the first node and the second node. Seen from a perspective of an RF signal propagating between the first port of the half lattice filter and the second port of the half lattice filter, the impedance element can be arranged before the phase shifter. However, it is also possible that the phase shifter is arranged before the impedance element in the parallel branch.

The impedance element can have a first terminal at its input side and a second terminal at its output side. Correspondingly, the phase shifter can have a first terminal at its input side and a second terminal at its output side. When the impedance element is arranged before the phase shifter then the second terminal of the impedance element is electrically connected to or coupled to the first terminal of the phase shifter. The first terminal of the impedance element can be directly electrically connected or coupled to the first node. The second terminal of the phase shifter can be directly electrically connected or coupled to the second node.

It is possible that the impedance element is selected from the capacitance element and an electro acoustic resonator.

Specifically, it is possible that the impedance element is represented by a capacitance element established by an acoustically inactive electro acoustic resonator. However, it is also possible that the impedance element has no piezoelectric material.

An electro acoustic resonator has an electrode structure combined with a piezoelectric material. Due to the piezoelectric effect—when an RF signal is applied to the resonator—the resonator converts between electromagnetic RF signals and acoustic RF signals.

An electro acoustic resonator can be selected from a BAW resonator (BAW=bulk acoustic wave), a GBAW resonator (GBAW=guided bulk acoustic wave), a SAW resonator (SAW=surface acoustic wave), a SMR-type BAW resonator (SMR=solidly mounted resonator), a FBAR-type BAW resonator (FBAR=film bulk acoustic resonator), a TF-SAW resonator (TF=thin-film), a TC-SAW resonator (TC=temperature compensated) or similar resonators.

In a SAW resonator interdigitated, comb-like electrode structures are arranged at or above the surface of a piezoelectric material. Acoustic waves propagate at the surface of the piezoelectric material in the longitudinal direction orthogonal to electrode fingers of the comb-like structure. In a BAW resonator a piezoelectric material is sandwiched between a bottom electrode and a top electrode and a longitudinal wave mode establishes a standing wave in a vertical direction.

It is possible that one or other or both of the two inductively coupled inductance elements have one of their connections coupled to ground. Thus, the corresponding one or the corresponding two inductance elements establish a connection between the parallel branch and ground. The coupling between the two inductance elements can be such that a coupling factor of k=1 is obtained. Also an opposite coupling with k=−1 is also possible. The sign of the coupling factor essentially determines the phase difference between the magnetic fields associated to the corresponding inductance elements where the phase difference of essentially 180° is obtained for a coupling factor k=−1.

It is possible that the phase shifter comprises a first capacitance element electrically connected to a first terminal and/or to a second terminal of the phase shifter.

In particular, it is possible that the first capacitance element electrically connects the first terminal of the phase shifter to ground or to the second terminal of the phase shifter.

It is possible that the phase shifter comprises a second capacitance element electrically connected to the second terminal of the phase shifter.

Then, it is possible that the second capacitance element electrically connects the second terminal of the phase shifter to ground.

In particular, it is possible that the first capacitance element of the phase shifter electrically connects the first terminal of the phase shifter to ground and the second capacitance element of the phase shifter electrically connects the second terminal of the phase shifter to ground.

It is possible that phase shifter comprises a third capacitance element electrically connecting the inductively coupled inductance elements to ground.

Correspondingly, it is possible that the phase shifter comprises a node. The first inductance element is electrically connected between the first terminal and the node. The second inductance element is electrically connected between the node and the second terminal. The third capacitance element electrically connects the node to ground.

It is possible that the filter further comprises a second electro acoustic resonator. The second electro acoustic resonator can be connected in the signal path between the first electro acoustic resonator and the second port when seen from the perspective of an RF signal propagating from the first port to the second port.

It is possible that the filter further comprises a second capacitance element electrically connected in the parallel branch between the first capacitance element and the second port. Further, the filter can comprise a third capacitance element electrically connected in the parallel branch between the second capacitance element and the second port.

Thus, a filter is provided where the parallel branch comprises three capacitance elements electrically connected in series between the first node and the second node.

At a node between the impedance element and the second capacitance element one of the two inductively coupled inductance elements can be connected with one terminal while the respective other terminal is connected to ground. Correspondingly, one terminal of the correspondingly coupled second inductance element is connected to a node between the second capacitance element and the third capacitance element while the respective other terminal of the second inductance element is electrically connected to ground.

Further, it is possible that the filter further comprises a fourth capacitance element electrically connected between the parallel branch and ground. The fourth capacitance element can be connected to the parallel branch such that it electrically connects the second node to ground.

The filter can comprise one or more impedance matching circuits.

Correspondingly, it is possible that the filter comprises a first impedance matching circuit electrically connected in the signal path between the first port and the first electro acoustic resonator. The filter can further comprise a second impedance matching circuit electrically connected in the signal path between the first electro acoustic resonator and the second port.

Specifically, it is possible that the first impedance matching circuit is electrically connected between the first port and the first node and the second electro acoustic resonator can be electrically connected between the second node and the second impedance matching circuit.

It is possible that the capacitance elements of the filter including the phase shifter are combined with the electro acoustic resonators in an acoustic package.

The acoustic package comprises all acoustically active circuit elements of the filter. The acoustically active elements of the filter are mechanical structures that must be isolated from detrimental influences of an environment, e.g. from foreign objects or particles that disturb the propagation of acoustic waves and from agents, e.g. water, in the atmosphere, e.g. during manufacturing. Correspondingly, the acoustic package can comprise one or more cavities where the acoustically active elements are integrated and hermetically sealed from the environment of the filter. The electro acoustic elements comprise electrode structures combined with a piezoelectric material to employ the piezoelectric effect. However, similar electrode structures can be used in the same manufacturing steps to produce the electrode structures of the capacitance elements. An acoustically inactive capacitance element having a substantially equal structure to an acoustically active circuit element can be obtained, e.g. by orienting the piezoelectric axes of the piezoelectric material not orthogonal to the electrode structures and/or not parallel to the direction of an electric field of the corresponding capacitance element. Then, the piezoelectric material can be used as a mere dielectric material to electrically insulate the two electrodes of the capacitance element.

It is possible that the half lattice filter is a bandpass filter that has a relative bandwidth $\Delta f$ being larger than or equal to 13% and smaller than or equal to 24%.

The relative bandwidth of a bandpass filter is defined as the bandwidth divided by the centre frequency of the passband.

It is possible that the inductively coupled inductance elements are established in a multilayer carrier substrate.

In particular, it is possible that the inductively coupled inductance elements are established as metallized structures, e.g. metallized conductor paths in the multilayer carrier substrate.

The carrier substrate can be selected from a LTCC substrate (LTCC=low temperature cofired ceramics), a HTCC substrate (HTCC=high temperature cofired ceramics), a laminate, and a substrate for integrated passive devices (IPD).

The acoustic package can be established utilizing one or several chips. The one or several chips of the acoustic package can be arranged on the carrier substrate in which the conductor patterns of the inductively coupled inductance elements are embedded.

The inductive coupling between the coupled inductance elements can be obtained by arranging one or several conductor segments of one of the inductance elements in the vicinity of the corresponding other inductance element. In particular, it is possible that both inductance elements comprise one or several windings that are arranged directly above one another or that have a horizontal overlap when stacked vertically.

The filter can be realized in a corresponding filter component comprising the physical elements necessary to establish the filter elements of the shown filter topology.

Correspondingly, it is possible that a filter component has electro acoustic resonators that are selected from BAW resonators, SAW resonators, GBAW resonators, TF-SAW resonators and TC-SAW resonators.

The suggested topology described above provides excellent electric properties to which the suggested phase shifter substantially contributes. The phase shifter preferably provides a phase shift close to 180° in the relevant frequency range spanning the wide bandwidth of the passband.

Capacitance elements electrically connected in parallel to the inductors help to realign the 180° phase shift for best matching conditions.

Central aspects and details of preferred embodiments are shown in the schematic accompanying figures.

Figure 1:
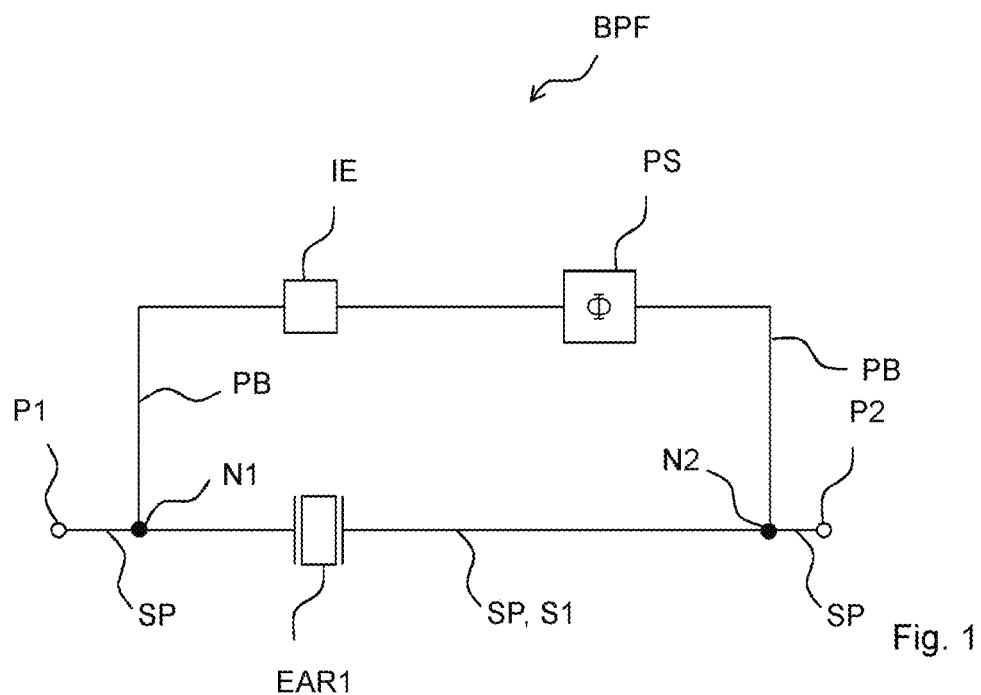
FIG. 1 shows a basic construction of a bandpass filter.

FIG. 1 shows basic circuit elements of a bandpass filter BPF. The bandpass filter BPF comprises a first port P1 and a second port P2. It is possible but not necessary that the first port P1 is an input port while the second port P2 is an output port o the bandpass filter BPF. The direction of propagation of RF signals can go from the first port P1 to the second port P2 or from the second port P2 to the first port P1.

The signal path SP is arranged between the first port P1 and the second port P2. The signal path comprises a first segment S1. The first segment S1 is arranged between a first node N1 and a second node N2. Further, a parallel branch PB is electrically connected in parallel to the first segment S1 between the first node N1 and the second node N2. In the first segment S1 a first electro acoustic resonator EAR1 is electrically connected between the first port P1 and the second port P2. In the parallel branch PB a series connection of an impedance element IE and a phase shifter PS is electrically connected. It is possible that the impedance element IE is electrically connected between the first node N1 and the phase shifter PS while the phase shifter PS is electrically connected between the impedance element IE and the second port P2 or the second node N2.

Figure 2:
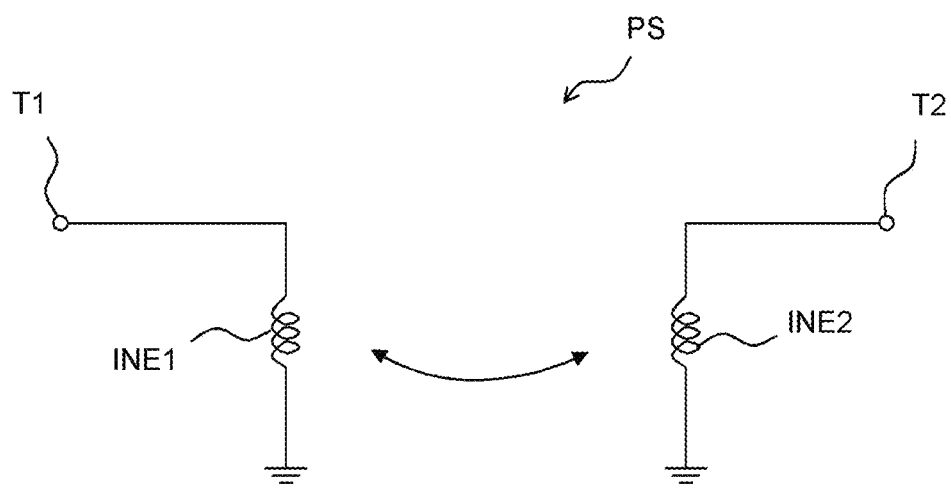
FIG. 2 shows a basic construction of a phase shifter.

FIG. 2 illustrates a basic embodiment of the phase shifter PS. The phase shifter PS has a first terminal T1 and a second terminal T2 and a connection to ground. The first terminal T1 can be an input terminal and the second terminal T2 can be an output terminal or vice versa. The phase shifter PS comprises a first inductance element INE1 and a second inductance element INE2. The first and the inductance elements establish inductively coupled inductance elements as indicated by the arrow. The first inductance element INE1 electrically connects the first terminal T1 to ground. The second inductance element INE2 electrically connects the second terminal T2 to ground.

The coupling between the inductance elements can be a direct coupling (k=1) or an opposite coupling (k)–1).

With the first terminal T1 the phase shifter PS can be electrically connected to or coupled to the impedance element shown in FIG. 1. With the second terminal T2 the phase shifter PS shown in FIG. 2 can be electrically connected to the second node N2 shown in FIG. 1.

The configuration comprising the topology shown in FIG. 1 with the embodiment of the phase shifter PS shown in FIG. 2 provides a substantially increased bandwidth while maintaining excellent other filter properties.

Figure 3:
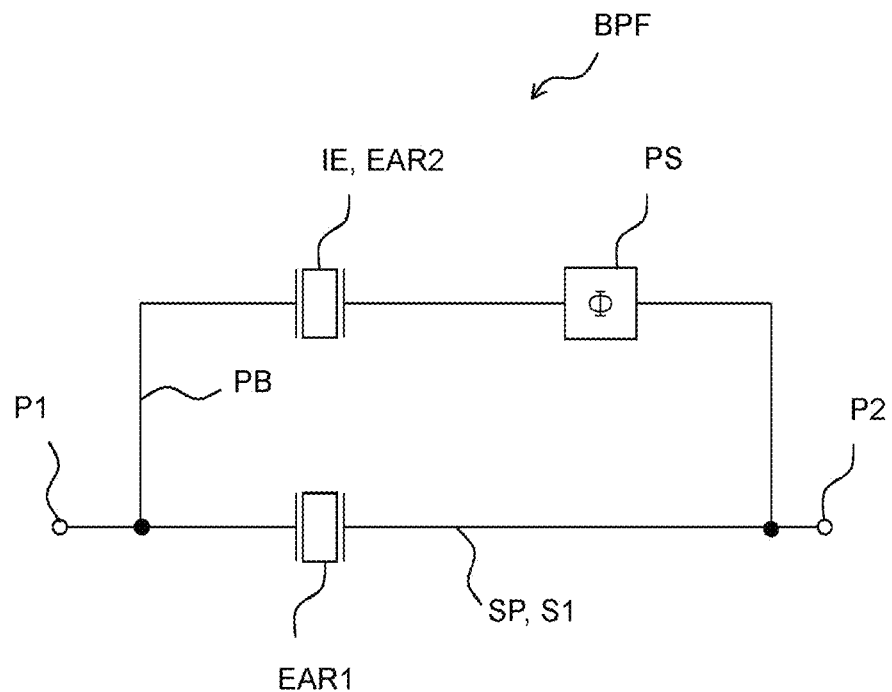
FIG. 3 shows the possibility of having a second electro acoustic resonator.

FIG. 3 illustrates the possibility of using a second electro acoustic resonator EAR2 in the bandpass filter BPF as the impedance element IE.

Figure 4:
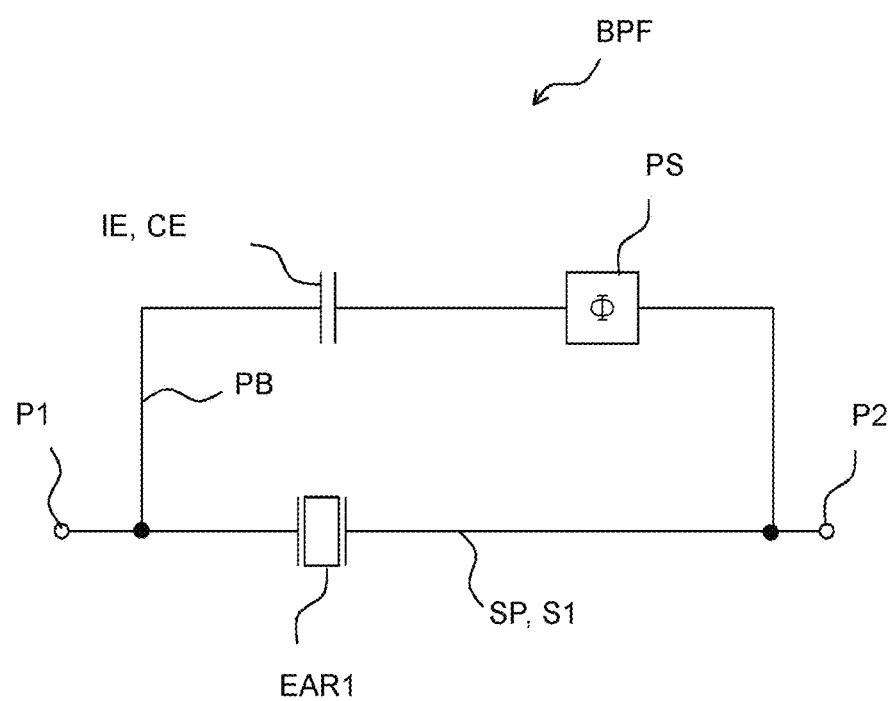
FIG. 4 shows the possibility of establishing the impedance element as a capacitance element.

FIG. 4 illustrates an alternative approach where the impedance element IE is realized by a capacitance element CE.

The difference between the topologies shown in FIGS. 3 and 4 is that the impedance element IE shown in FIG. 3 is acoustically active while the impedance element IE shown in FIG. 4 is acoustically inactive.

However, the basic construction of the two impedance elements can be essentially similar except for the acoustic activity.

Figure 5:
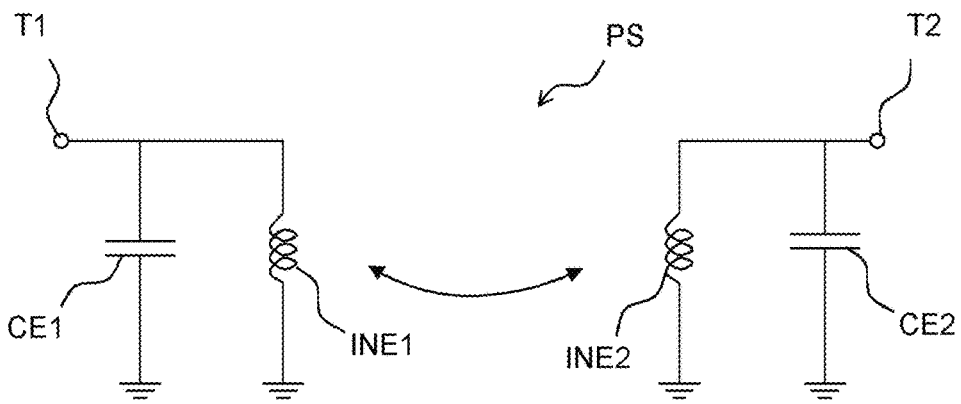
FIG. 5 shows one parallel capacitance element per inductance element in the phase shifter.

FIG. 5 shows a further possibility of providing the phase shifter PS. In addition to the inductively coupled inductance elements INE1, INE2 a first capacitance element CE1 is electrically connected between the first terminal and ground. A second capacitance element CE2 is electrically connected between the second terminal T2 and ground.

Figure 6:
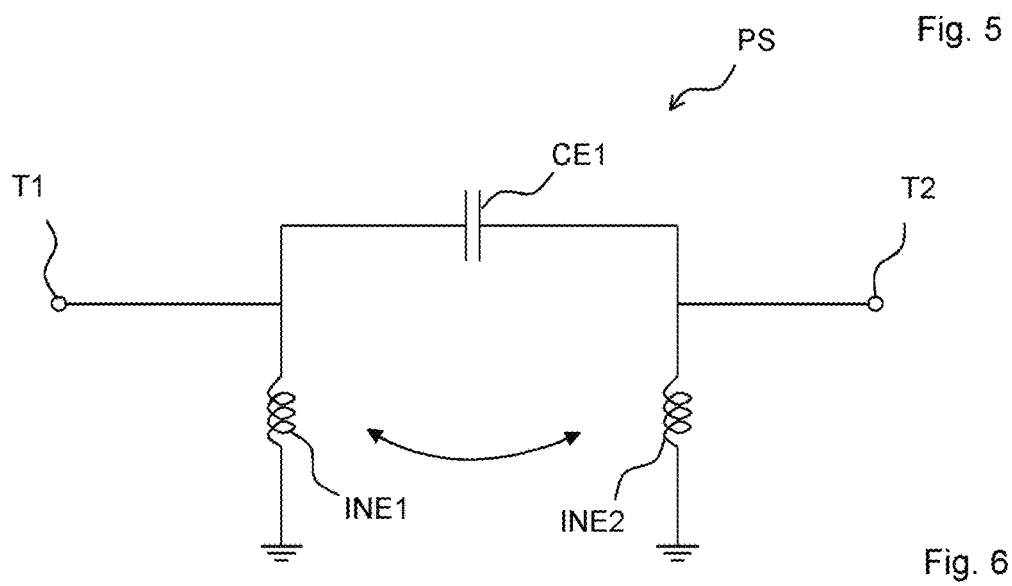
FIG. 6 shows the use of a single capacitance element between the first terminal and the second terminal of the phase shifter.

FIG. 6 shows a possibility of a phase shifter PS where in addition to the first and second coupled inductance elements INE1, INE2 a first capacitance element CE1 is connected between the first terminal T1 and the second terminal T2.

The two capacitance elements electrically connected in parallel to the inductance elements can be optionally present in the phase shifter shown in FIG. 6.

Figure 7:
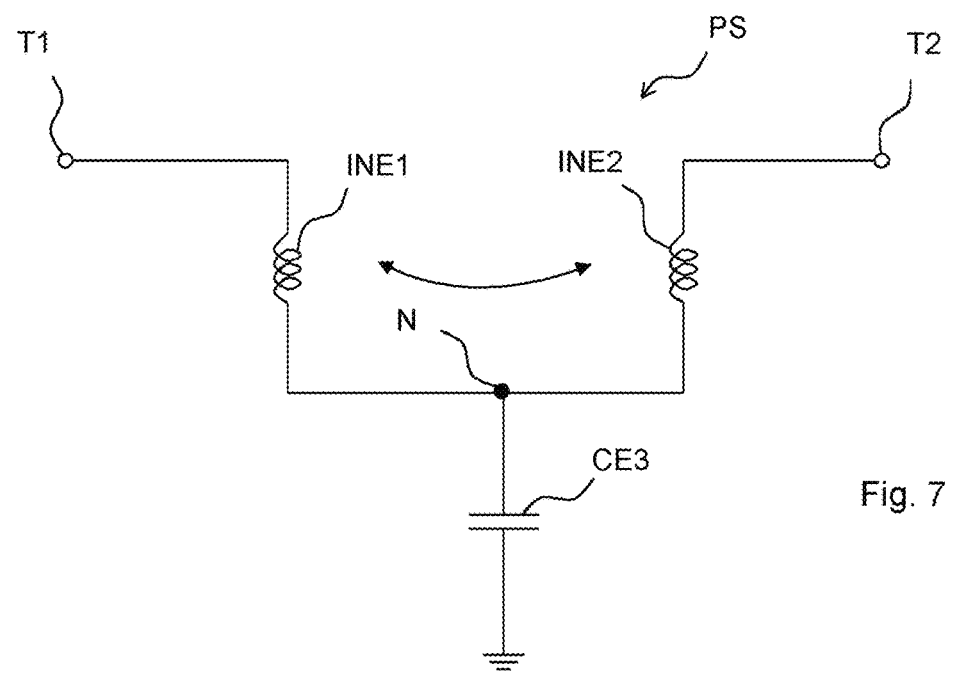
FIG. 7 illustrates the possibility of using a single capacitance element for shunting both inductance elements.

FIG. 7 shows the possibility of shunting the corresponding terminals of the coupled inductance elements INE1, INE2 via a specifically dedicated node N and via a third capacitance element CE3 to ground.

The capacitance element shown in FIG. 6 and the two capacitance elements shown in FIG. 5 can be optionally present in the phase shifter PS of FIG. 7.

Figure 8:
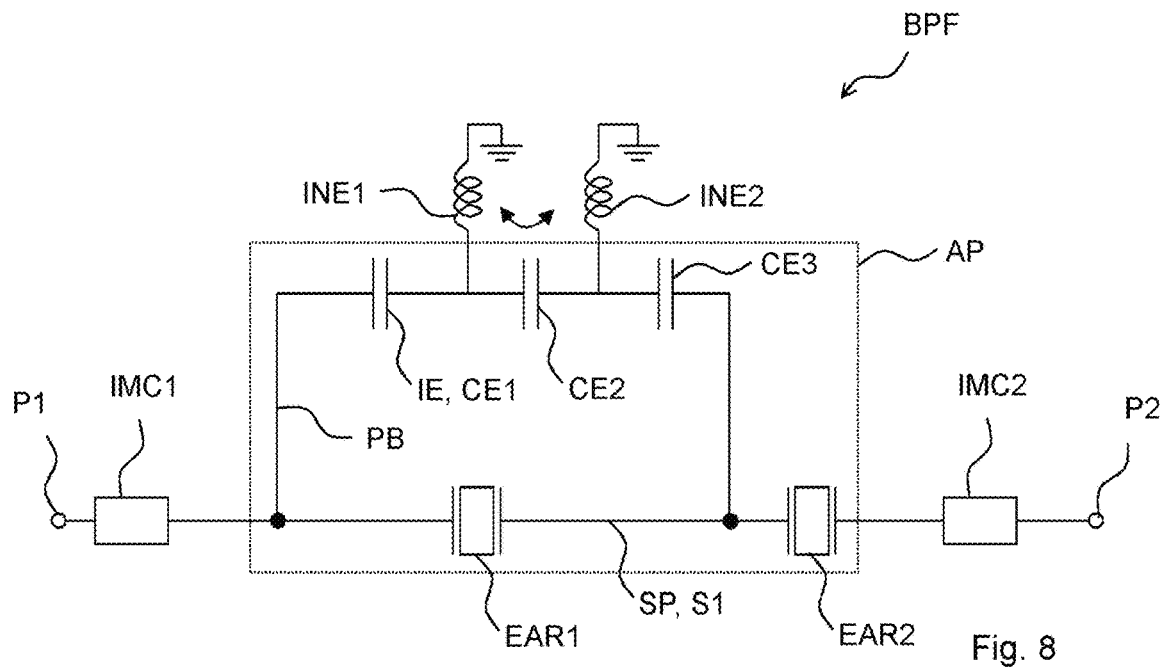
FIG. 8 illustrates a possible combination of the phase shifter and the other circuit elements of the bandpass filter.

FIG. 8 shows a possible combination of the circuit elements of the phase shifter in combination with the other circuit elements of the bandpass filter BPF.

In addition, impedance matching circuits can also be present.

The topology of the bandpass filter BPF shown in FIG. 8 comprises an additional, second electro acoustic resonator EAR2 between the second node and the second port P2. A first impedance matching circuit IMC1 is electrically arranged between the first port P1 and the first node. A second impedance matching circuit IMC2 is electrically configured between the second electro acoustic resonator EAR2 and the second port P2. In the parallel branch the impedance element IE is realized as a first capacitance element CE1. An additional, second capacitance element CE2 is arranged between the first capacitance element CE1 and the second node. A further, third capacitance element CE3 is electrically connected between the second capacitance element CE2 and the second node. Thus, the three capacitance elements CE1, CE2 and CE3 establish a series connection in the parallel branch PB.

One terminal of the first coupled inductance elements INE1 is connected to a node between the first capacitance element CE1 and the second capacitance element CE2. The respective other terminal of the inductance element INE1 is connected to ground. Correspondingly, a first terminal of the second coupled inductance element INE2 is electrically connected to a node between the second capacitance element CE2 and the third capacitance element CE3. The respective other terminal of the inductance element is connected to ground.

The two electro acoustic resonators EAR1, EAR2 together with the three capacitance elements CE1, CE2, CE3 are realized in the acoustic package AP. The respective other circuit elements, e.g. of the first and of the second impedance matching circuit IMC1, IMC2 and the inductance elements are established outside the acoustic package, e.g. within a multilayer construction of the carrier substrate.

The first and the second impedance matching circuits IMC1, IMC2 can comprise LC elements electrically configured in Pi and Tee configurations to match an external circuit environment of the bandpass filter BPF at the corresponding ports P1, P2. The matching impedance can be 50 ohm, 100 ohm or 200 ohm.

Figure 9:
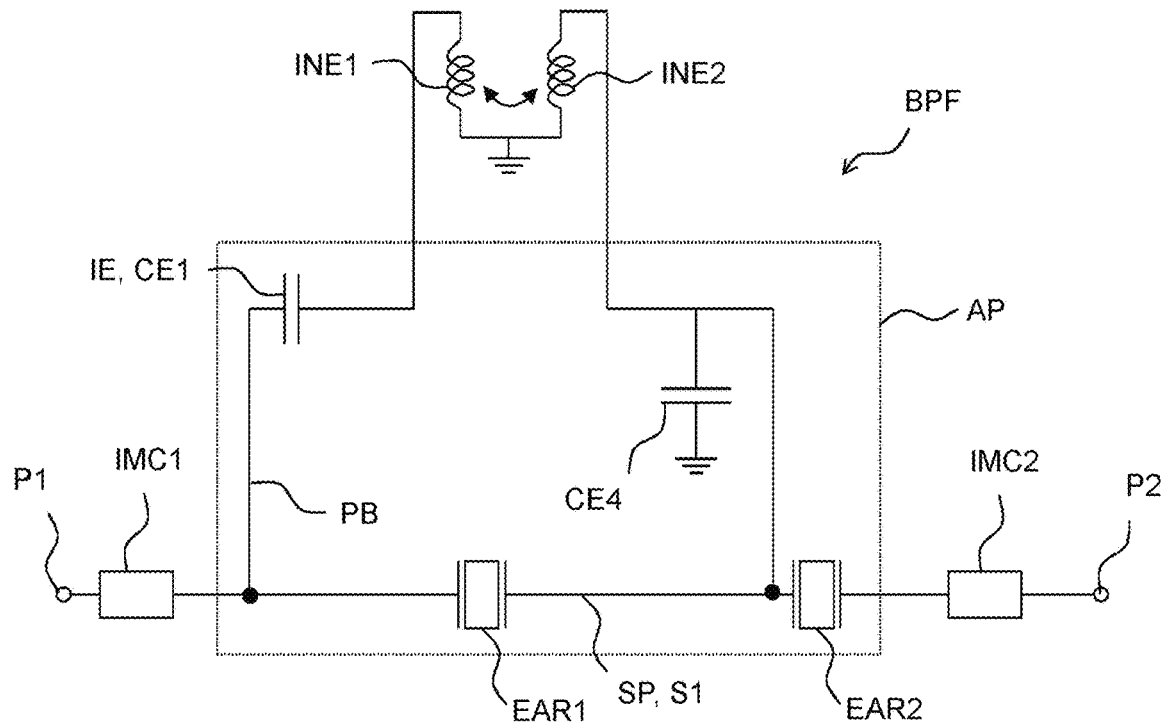
FIG. 9 illustrates another approach to electrically combine the circuit elements of the phase shifter with the other circuit elements of the bandpass filter.

FIG. 9 illustrates a configuration where the parallel branch PB is electrically connected to ground at the place of the second node via a fourth capacitance element CE4. A second electro acoustic resonator EAR2 is electrically connected between the second node N2 and the second port P2. Further, a first impedance matching circuit IMC1 and a second impedance matching circuit IMC2 are electrically connected between the first port P1 and the first node and between the second electro acoustic resonator EAR2 and the second port P2, respectively.

While the inductively coupled inductance elements electrically shunt the parallel branch PB to ground in the topology shown in FIG. 8, the inductance elements INE1, INE2 are electrically connected in series in the parallel branch PB and the node between the two inductance elements INE1, INE2 is electrically connected to ground.

The two electro acoustic resonators EAR1, EAR2 and the impedance element IE are realized as a first capacitance element CE1 and the fourth capacitance element CE4 are realized in the acoustic package AP while the respective other circuit elements are realized outside the acoustic package AP, e.g. in a multilayer construction of the carrier substrate.

Figure 10:
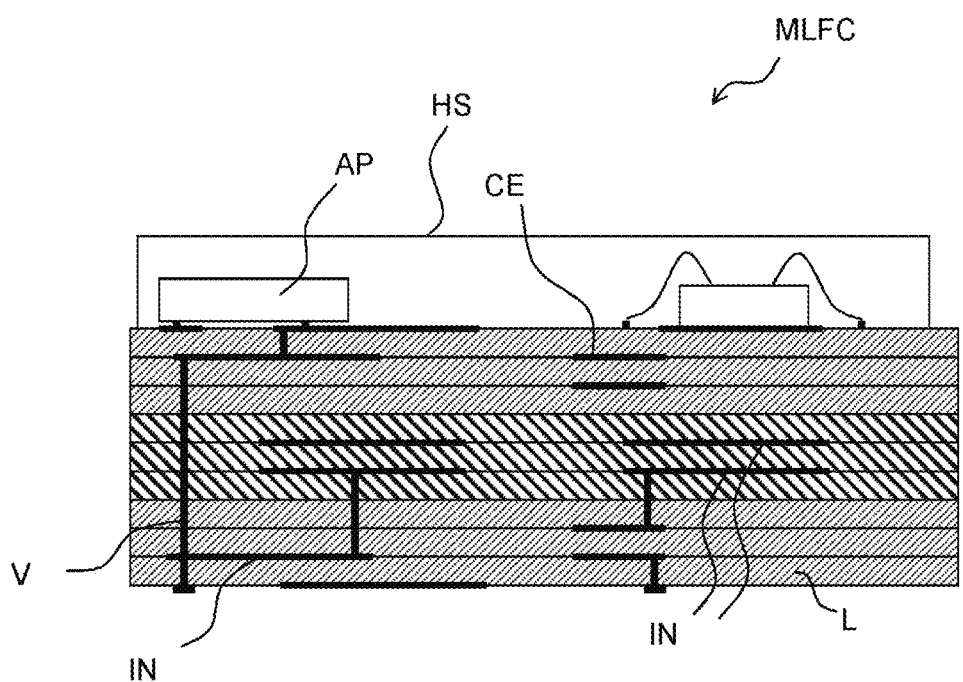
FIG. 10 shows a cross-section through a multilayer filter component.

FIG. 10 illustrates a cross-section through a possible multilayer filter component MLFC. The multilayer filter component comprises a multilayer carrier substrate with a plurality of layers L. The layers L comprise or consist of a dielectric material. Conductive structures realized as metallized patterns between the layers L realize passive circuit elements such as impedance elements like inductance elements IN and capacitance elements CE. The acoustic package AP is arranged at the top side of the multilayer carrier substrate and electrically connected to the impedance elements in the substrate. A connection can take place via a bump connection or via wire bonding connections. The sensitive MEMS structures (MEMS=micro electro mechanical system) are protected in a hermetically sealed environment HS.

Figure 11:
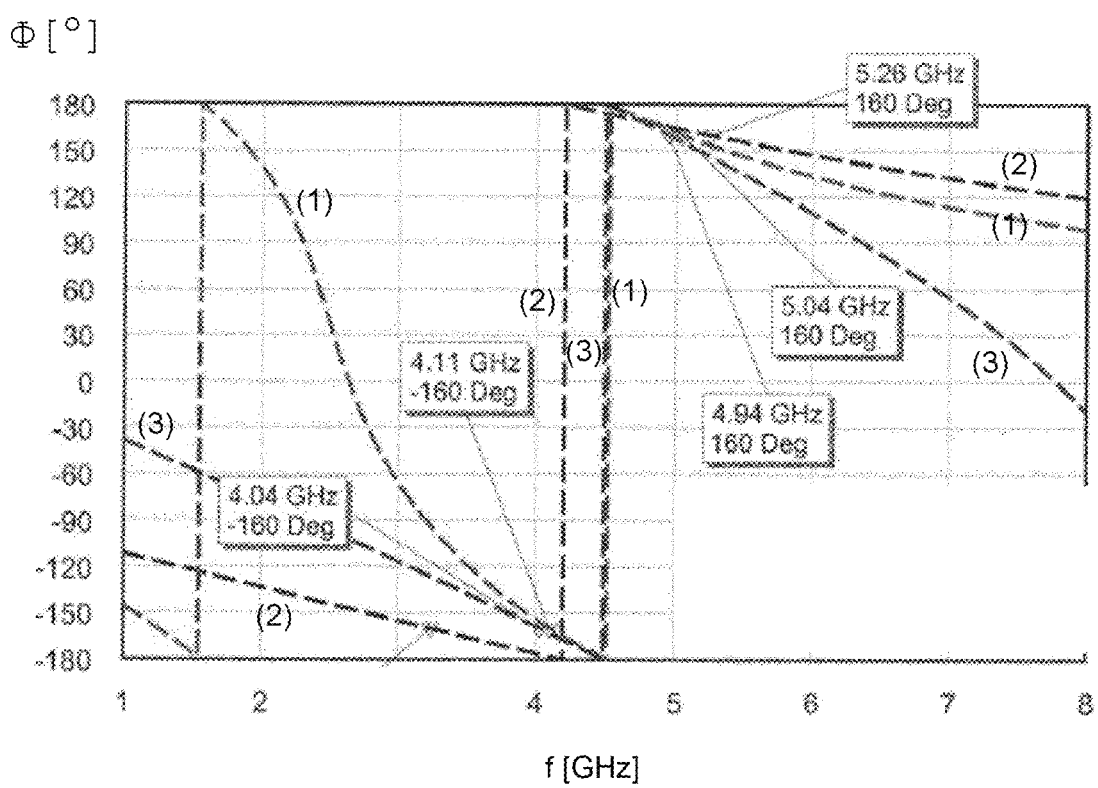
FIG. 11 shows phase delays of different phase shifter topologies.

FIG. 11 shows a comparison of three different phase shifter topologies. Curve 1 shows a three-stages high pass phase shifter. Curve 3 shows a three-stages low pass phase shifter. In contrast, curve 2 shows a phase shifter comprising two coupled parallel coils as suggested above. The phase error (slope of the phase curve) for frequencies around 4.2 GHz is much smaller in curve 2, i.e., a phase shift around 180° degrees is achieved for a much wider frequency range. In this context it is to be noted that a phase difference of 180° is equal to a phase difference of −180°. The vertical boundaries of −180° and 180° are choosen arbitrarily. Thus, a relatively stable phase in a wide frequency range, e.g. from 3 GHz to 6 GHz is obtained.

Figure 12:
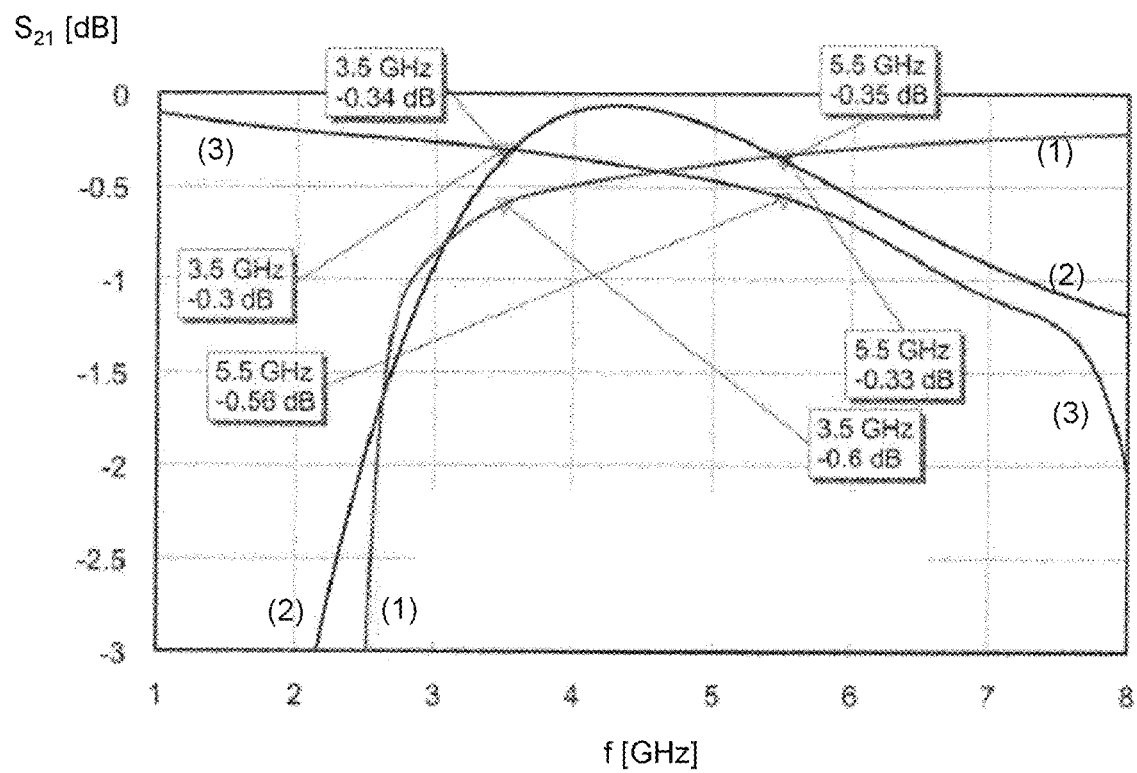
FIG. 12 shows the insertion loss of different phase shifter topologies.

FIG. 12 shows the corresponding insertion loss of the phase shifters described in the context of FIG. 11. Curve 2 denotes the insertion loss of the phase shifter with the two coupled inductance elements. A wide frequency range with a low insertion loss and a phase shift around 180° are simultaneously obtained.

Figure 13:
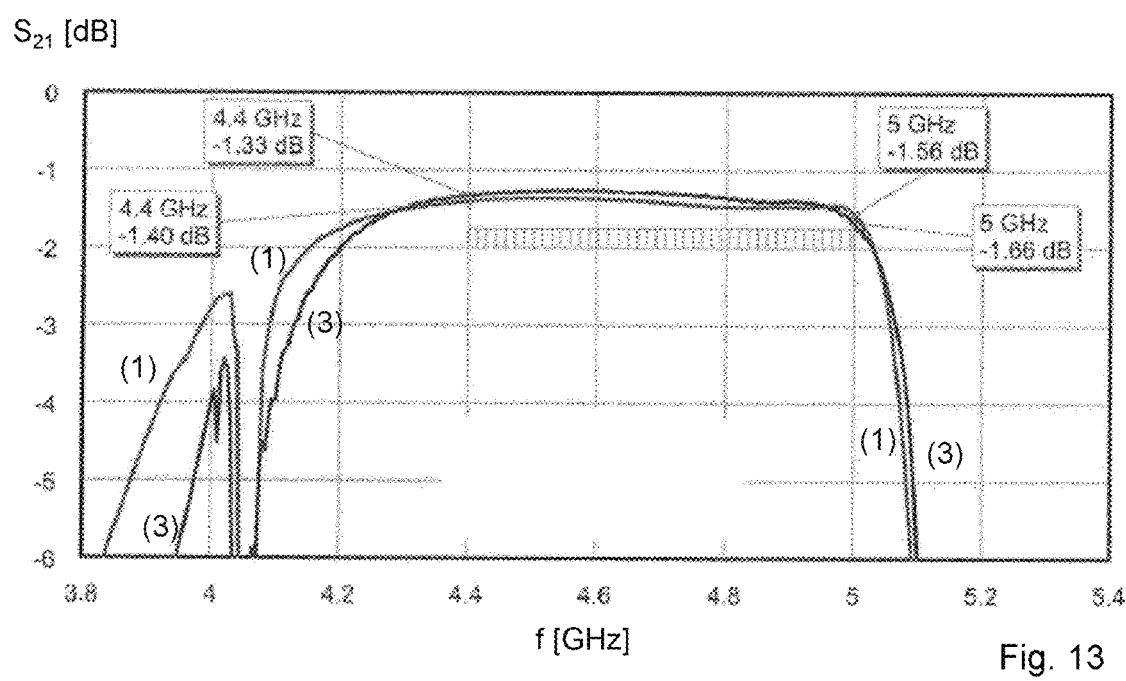
FIG. 13 shows a comparison between a proposed filter (curve 1) and a conventional filter (curve 3)

FIG. 13 shows the passband performance of the bandpass filter shown in FIG. 8 without a coupling of the inductance elements (curve 1) and the corresponding passband performance of the bandpass filter according to FIG. 9 with coupled inductance elements (curve 3). The bandwidth specification is fulfilled in both filters, the important point as mentioned in the following paragraph, is that both passband bandwidth specification and isolation level above the passband can be simultaneously achieved.

Figure 14:
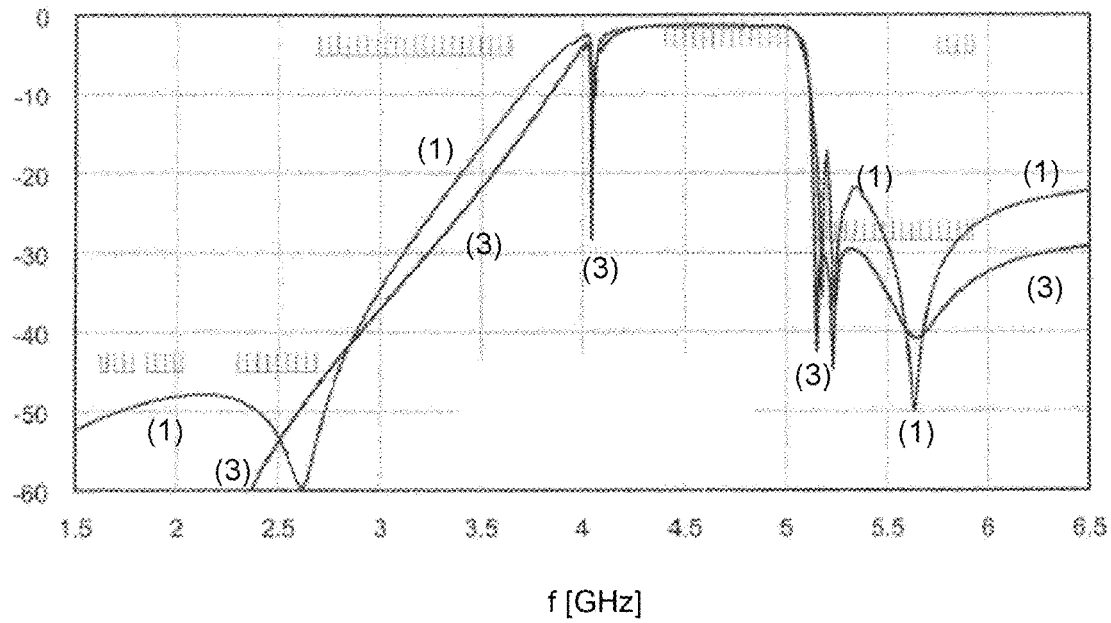
FIG. 14 shows a wideband view of the parameters shown in FIG. 13.
Figure 15:
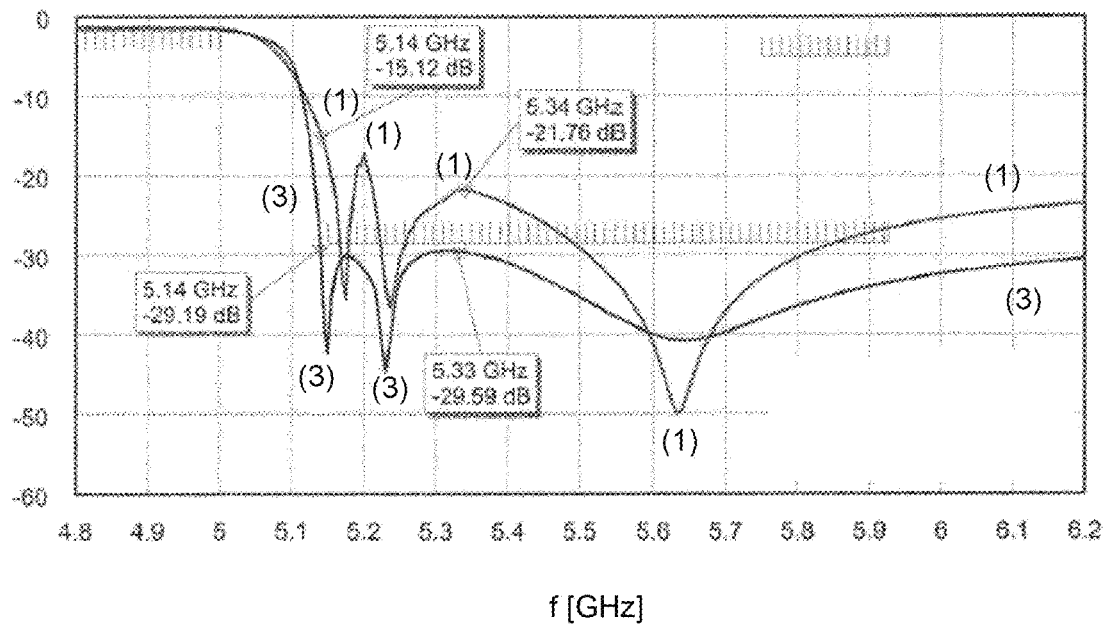
FIG. 15 shows the right skirt performances of the proposed and of a conventional filter.

FIG. 14 illustrates the corresponding performances shown in FIG. 13 in a wider frequency range FIG. 15 shows the right skirt performance of a topology indicated by FIG. 8 without the coupling of the inductance coils (curve 1) and the right skirt performance of the filter shown in FIG. 9 including the coupling between the inductance elements (curve 3) showing that the isolation levels above the passband are significantly improved fulfilling now the specified parameters.

The above-described bandpass filters provide a substantially better close-in suppression above the passband while other important filter parameters are essentially maintained.

The filter or the filter component are not limited to the specific details shown in the figures or described above. Filters or filter components can comprise further circuit elements, e.g. for impedance matching, and further structural elements, e.g. for embedding impedance elements in a multilayer substrate or protecting sensitive MEMS structures like resonators from detrimental influences.

LIST OF REFERENCE SIGNS

AP: acoustic package
BPF: bandpass filter
CE: capacitance element
CE1, CE2, CE3 CE4: capacitance element
EAR1, EAR2: first, second electro acoustic resonator
HS: hermetical seal
IE: impedance element
IMC1, IMC2: first, second impedance matching circuit
IN: inductance element
INE1, INE2: first, second inductively coupled inductance element
L: layer
MLFC: multilayer filter component
N: node N1, N2: first, second node in the signal path
P1, P2: first, second port of the filter
PB: parallel branch
PS: phase shifter
S1: first segment of signal path
SP: signal path
T1, T2: first, second terminal of the phase shifter
W: wire connection through one or more layers

The invention claimed is:

1. A half lattice filter, comprising:
an input port, an output port and a signal path between the input port and the output port,
a first segment in the signal path,
a parallel branch that is electrically connected in parallel to the first segment of the signal path,
a first electro acoustic resonator in the first segment,
an impedance element in the parallel branch, and
a phase shifter having a first and second terminal, the phase shifter electrically connected in the parallel branch in series to the impedance element,
wherein the phase shifter comprises two inductively coupled inductance elements and a first capacitance element electrically connected to at least one of the first terminal and the second terminal.

2. The half lattice filter of claim 1, wherein the impedance element is selected from a capacitance element and an electro acoustic resonator.

3. The half lattice filter of claim 1, where each of the two inductively coupled inductance elements has one connection coupled to ground.

4. The half lattice filter of claim 1, wherein the phase shifter comprises a second capacitance element electrically connected to a second terminal of the phase shifter.

5. The half lattice filter of claim 4, wherein the phase shifter comprises a third capacitance element electrically connecting the two inductively coupled inductance elements to ground.

6. The half lattice filter of claim 1, further comprising a second electro acoustic resonator electrically connected in a signal path between the first electro acoustic resonator and a second port.

7. The half lattice filter of claim 1, further comprising a second capacitance element electrically connected in the parallel branch between the first capacitance element and a second port and
a third capacitance element electrically connected in the parallel branch between the second capacitance element and the second port.

8. The half lattice filter of claim 5, further comprising a fourth capacitance element electrically connected between the parallel branch and ground.

9. The half lattic filter claim 1, further comprising
a first impedance matching circuit electrically connected in a signal path between a first port and the first electroacoustic resonator and/or
a second impedance matching circuit electrically connected in a signal path between the first electroacoustic resonator and a second port.

10. A half lattice filter comprising:
an input port, an output port and a signal path between the input port and the output port;
a first segment in the signal path;
a parallel branch that is electrically connected in parallel to the first segment of the signal path;
a first electro acoustic resonator in the first segment;
an impedance element in the parallel branch;
a phase shifter having two inductively coupled inductance elements, the phase shifter electrically connected in the parallel branch in series to the impedance element; and
a plurality of capacitance elements, wherein the plurality of capacitance elements are combined with the electro acoustic resonator in an acoustic package.

11. The half lattice filter claim 1, being a band pass filter with a relative bandwidth $\Delta f$ with $13\% <= \Delta f <= 24\%$.

12. The half lattice filter of claim 1, wherein the two inductively coupled inductance elements are established in a multilayer carrier substrate.

13. The half lattice filter of claim 12, wherein the multilayer carrier substrate is selected from a LTCC substrate, a HTCC substrate, a laminate, a substrate for integrated passive devices.

14. The half lattice filter of claim 1, wherein the electro acoustic resonator is selected from a BAW resonator, a SAW resonator, a GBAW resonator, a TF-SAW resonator, or a TC-SAW resonator.

* * * * *